(12) United States Patent
Shah et al.

(10) Patent No.: US 11,907,531 B2
(45) Date of Patent: Feb. 20, 2024

(54) OPTIMIZING STORAGE-RELATED COSTS WITH COMPRESSION IN A MULTI-TIERED STORAGE DEVICE

(71) Applicant: Adobe Inc., San Jose, CA (US)

(72) Inventors: Raunak Shah, Pune (IN); Koyel Mukherjee, Bangalore (IN); Khushi, Bathinda (IN); Kavya Barnwal, Jamui (IN); Karanpreet Singh, Hoshiarpur (IN); Harsh Kesarwani, Prayagraj (IN); Ayush Chauhan, Austin, TX (US)

(73) Assignee: Adobe Inc., San Jose, CA (US)

( * ) Notice: Subject to any disclaimer, the term of this patent is extended or adjusted under 35 U.S.C. 154(b) by 51 days.

(21) Appl. No.: 17/851,443

(22) Filed: Jun. 28, 2022

(65) Prior Publication Data
US 2023/0418468 A1    Dec. 28, 2023

(51) Int. Cl.
*G06F 3/06*   (2006.01)

(52) U.S. Cl.
CPC ............ *G06F 3/0604* (2013.01); *G06F 3/067* (2013.01); *G06F 3/0644* (2013.01)

(58) Field of Classification Search
None
See application file for complete search history.

(56) References Cited

FOREIGN PATENT DOCUMENTS

| CN | 101227590 B | * | 3/2013 | ......... H04L 65/4084 |
| JP | 7073065 B2 | * | 5/2022 | ........... H04L 1/0003 |

OTHER PUBLICATIONS

Amazon S3 Intelligent-Tiering Storage Class, Amazon, Available Online at: https://aws.amazon.com/s3/storage-classes/intelligent-tiering/, Accessed from Internet on Jul. 6, 2022, pp. 1-17.
Storage Optimization Analytics: Reduce Data Storage Costs With Intelligent Cloud Migration, Accenture, Available Online at: https://www.accenture.com/_acnmedia/Accenture/Conversion-Assets/Secure/pdf-no-index-3/Accenture-Storage-Optimization-Analytics.pdf, Jun. 2021, 11 pages.

(Continued)

*Primary Examiner* — Brian R Peugh
(74) *Attorney, Agent, or Firm* — Kilpatrick Townsend & Stockton LLP

(57) ABSTRACT

Some techniques described herein relate to determining how to optimally store datasets in a multi-tiered storage device with compression. In one example, a method includes assigning, to a data partition of a dataset, a priority based on access patterns of the data partition. Compression data is accessed describing results of compressing a data sample associated with the data partition using multiple compression schemes. Based both on the priority of the data partition and the compression data, a storage tier is determined for storing the data partition in the multi-tiered storage device. Further, based both on the priority of the data partition and the compression data, a compression scheme is determined for compressing the data partition for storage in the multi-tiered storage device. The data partition is compressed using the compression scheme to produce a compressed data partition, and the compressed data partition is stored in the storage tier.

20 Claims, 6 Drawing Sheets

(56) References Cited

OTHER PUBLICATIONS

Tiered Storage—Building the Optimal Storage Infrastructure, Horison, Available Online at: http://i.crn.com/sites/default/files/ckfinderimages/userfiles/images/crn/custom/2021/FujiFilm_CloseUp_Q1_2021_Horison_Tiered-Storage_2020.pdf, 2020, 8 pages.

Towards Optimizing Storage Costs on the Cloud, Woodstock '18: Association for Computing Machinery Symposium on Neural Gaze Detection, Jun. 3-5, 2018, 30 pages.

Agarwal et al., BlinkDB: Queries with Bounded Errors and Bounded Response Times on Very Large Data, Available Online at: https://sameeragarwal.github.io/blinkdb_eurosys13.pdf, Apr. 2013, pp. 29-42.

Boursier et al., Plato: Approximate Analytics over Compressed Time Series with Tight Deterministic Error Guarantees, Proceedings of the VLDB Endowment, vol. 13, Issue 7, Sep. 2019, pp. 1-17.

Chiarot et al., Time Series Compression: A Survey, Available Online at: https://arxiv.org/pdf/2101.08784.pdf, Jan. 2021, pp. 1-15.

Christman, Implementing an Automated Compression Tiering and Storage Tiering Solution using Automatic Data Optimization, Oracle, Available Online at: https://blogs.oracle.com/dbstorage/post/implementing-an-automated-compression-tiering-and-storage-tiering-solution-using-automatic-data-optimization, May 25, 2021, pp. 1-5.

Devarajan et al., An Intelligent, Adaptive, and Flexible Data Compression Framework, 19th IEEE/ACM International Symposium on Cluster, Cloud and Grid Computing, May 2019, pp. 1-10.

Devarajan et al., HCompress: Hierarchical Data Compression for Multi-Tiered Storage Environments, 2020 Institute of Electrical and Electronics Engineers International Parallel and Distributed Processing Symposium, May 2020, pp. 557-566.

Devarajan et al., HFetch: Hierarchical Data Prefetching for Scientific Workflows in Multi-Tiered Storage Environments, 2020 Institute of Electrical and Electronics Engineers International Parallel and Distributed Processing Symposium, May 2020, pp. 62-72.

Kammoun et al., Generative Adversarial Networks for face Generation: A Survey, Association for Computing Machinery Computing Surveys, Mar. 2022, 37 pages.

Kougkas et al., Hermes: A Heterogeneous-Aware Multi-Tiered Distributed I/O Buffering System, Proceedings of the 27th International Symposium on High-Performance Parallel and Distributed Computing, Jun. 2018, pp. 219-230.

Krintz et al., Adaptive On-the-Fly Compression, Institute of Electrical and Electronics Engineers Transactions on Parallel and Distributed Systems, vol. 17, No. 1, Jan. 2006, pp. 15-24.

Kumar et al., Quiver: An Informed Storage Cache for Deep Learning, Proceedings of the 18th USENIX Conference on File and Storage Technologies, Feb. 2020, pp. 283-296.

Lin et al., Experiencing SAX: a Novel Symbolic Representation of Time Series, Data Mining and Knowledge Discovery, vol. 15, Aug. 2007, 31 pages.

Mansouri et al., Cost Optimization Algorithms for Hot and Cool Tiers Cloud Storage Services, 2018 Institute of Electrical and Electronics Engineers 11th International Conference on Cloud Computing, Jul. 2018, pp. 622-629.

Mansouri et al., Cost Optimization for Dynamic Replication and Migration of Data in Cloud Data Centers, Institute of Electrical and Electronics Engineers Transactions on Cloud Computing, vol. 7, No. 3, 2019, pp. 1-14.

Sivathanu et al., INSTalytics: Cluster Filesystem Co-Design for Big-Data Analytics, Conference on File and Storage Technologies, Feb. 2019, pp. 235-248.

Wang et al., DIESEL: A Dataset-Based Distributed Storage and Caching System for Large-Scale Deep Learning Training, 49th International Conference on Parallel Processing, Aug. 2020, 11 pages.

Xu et al., OrpheusDb: A Lightweight Approach to Relational Dataset Versioning, Association for Computing Machinery International Conference, May 2017, pp. 1655-1658.

Yu et al., A Fast LSH-Based Similarity Search Method for Multivariate Time Series, Information Sciences, vol. 476, Feb. 2019, pp. 337-356.

Zhang et al., SuRF: Practical Range Query Filtering with Fast Succinct Tries, Proceedings of the 2018 International Conference on Management of Data, Jun. 10-15, 2018, pp. 323-336.

Zhou et al., Incorporating Partitioning and Parallel Plans Into the Scope Optimizer, Institute of Electrical and Electronics Engineers 26th International Conference on Data Engineering, Apr. 2010, 12 pages.

\* cited by examiner

OPTIMIZING STORAGE-RELATED COSTS WITH COMPRESSION IN A MULTI-TIERED STORAGE DEVICE

TECHNICAL FIELD

This disclosure generally relates to data storage and, more specifically, to optimizing storage-related costs with compression in a multi-tiered storage device.

BACKGROUND

Activity on the internet generates data. This data includes, for instance, information describing the internet activity as well as forms, documents, images, and videos uploaded to the internet. This data is typically stored in cloud platforms and can be used for purposes such as analytics, insight generation, or model training. However, as more and more activities occur over the internet, thereby generating massive amounts of data, the total cost of storing and reading data has become a cause of concern for many businesses. A significant percentage of business expenditures may need to be allocated to cover storage costs, which include computing costs related to writing data, compression and decompression, and reading data as well as economic costs (i.e., the expense) of obtaining storage devices.

Ideally, an organization might prefer to only use storage systems with low latency, resulting from low computing costs involved in reading and writing data, but this can be cost prohibitive. One technique for reducing storage costs while maintaining low latency as needed is the implementation of a multi-tiered storage device in a cloud. The multiple tiers have varying economic costs and varying latencies. Typically, a tier with a lower latency has a higher economic cost, and a tier with a higher latency has a lower economic cost. Varying the economic costs and latencies across tiers can reduce expenses while maintaining low latency for some data, but it is nontrivial to determine which data to store in each tier.

SUMMARY

Some techniques described herein relate to a storage system for determining how to optimally store a dataset in a multi-tiered storage device with compression. In some examples, the multi-tiered storage device includes multiple storage tiers configured to store data. Each tier is associated with respective characteristics related to latency, economic cost, or other factors. An example of the storage system includes a dataset extractor module, a data partitioner module, a compression predictor module, an optimization engine, and a storage manager module.

In some embodiments, the data extractor module identifies individual datasets and associated metadata and extracts, from the datasets, samples to be provided to the compression predictor module. The data partitioner module receives the datasets along with access logs describing accesses to the datasets. Based on the access logs, the data partitioner module partitions each dataset into data partitions and assigns a respective priority to each data partition. The priority of a data partition can be based on frequency or recency of access to the data partition according to the access logs. The compression predictor module applies various compression schemes on samples provided by the data extractor module and, as a result, determines compression data describing the performance of each compression scheme on each dataset.

In some embodiments, the optimization engine uses a cost function that takes as input information about the data partitions and their respective priorities, the compression data, and information about the various tiers of the multi-tiered storage device. The optimization engine optimizes the cost function to determine a respective compression scheme and a respective storage tier, within the multi-tiered storage device, for each data partition. The storage manager module then stores each data partition in the respective storage tier of the multi-tiered storage device using the respective compression scheme.

These illustrative embodiments are mentioned not to limit or define the disclosure, but to provide examples to aid understanding thereof. Additional embodiments are discussed in the Detailed Description, and further description is provided there.

BRIEF DESCRIPTION OF THE DRAWINGS

Features, embodiments, and advantages of the present disclosure are better understood when the following Detailed Description is read with reference to the accompanying drawings.

DETAILED DESCRIPTION

Figure 1:
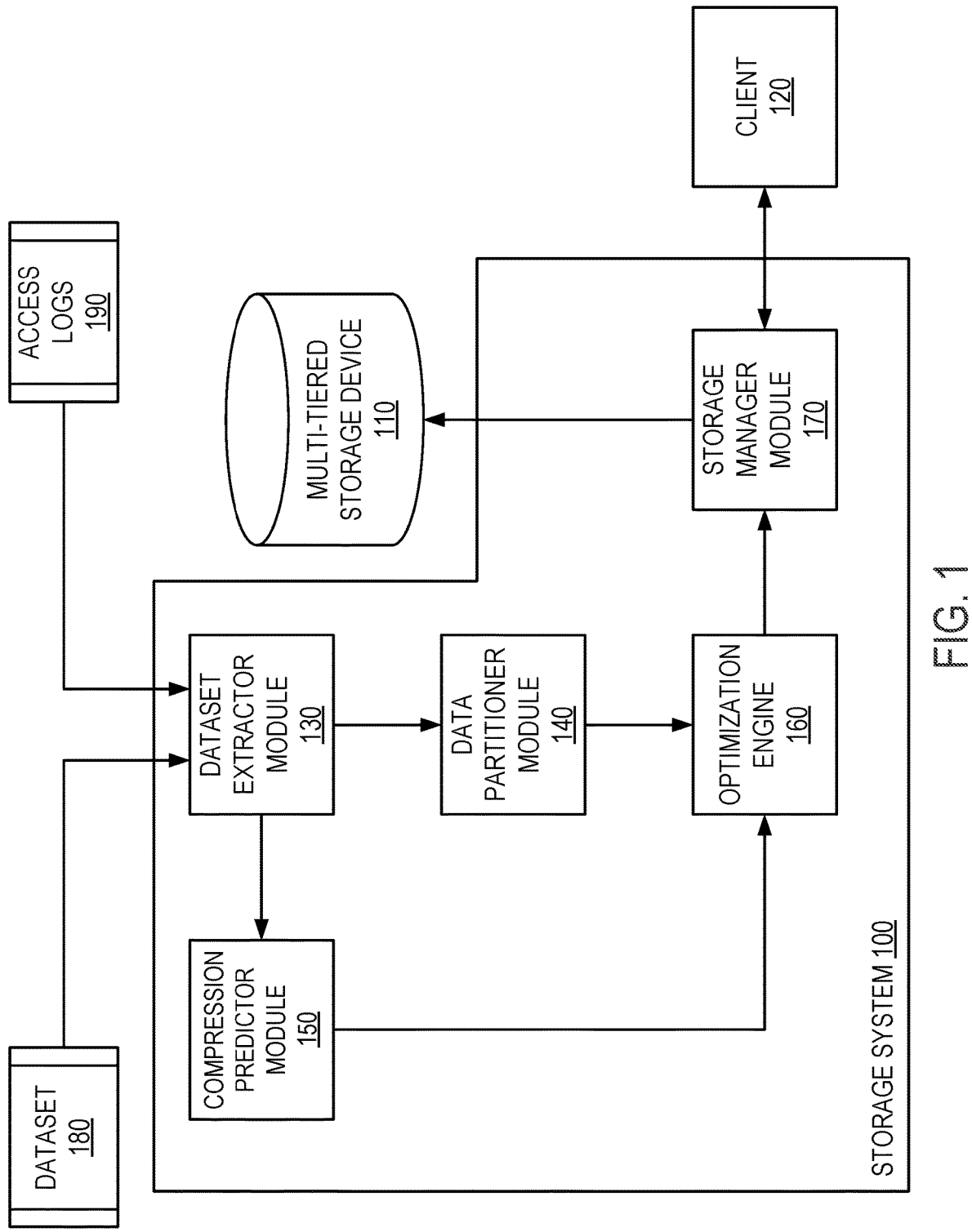
FIG. 1 is a diagram of an example of a storage system configured to manage the storage of data in a multi-tiered storage device with compression, according to some embodiments described herein.

As described above, a multi-tiered storage device can be a useful tool for combining low-latency storage with storage having low economic costs. However, difficulty arises in determining which data is stored at which tier of the multi-tiered storage device. Multi-tiered storage devices can be used in combination with compression to reduce the storage space needed, and thus the economic cost of providing that storage, but then the decision of which compression schemes to utilize for each portion of data adds further complexity to the problem. Certain existing systems decide where (i.e., which tier) to store data based on access patterns, but these existing systems typically do not take compression into consideration, or they utilize only a single compression technique. Other existing systems use compression in combination with multi-tiered storage but make no attempt to optimize latency when determining where to store data.

In contrast to existing systems, some embodiments of a storage system described herein consider both latency and access patterns and, further, dynamically select a compression scheme for each data partition being stored. An embodiment of the storage system divides a dataset into data partitions, merges data partitions if appropriate, and optimizes a cost function based on economic cost, latency, or other factors to determine a tier and a compression scheme for each data partition.

The following non-limiting example is provided to introduce certain embodiments. In this example, a computing system executes a storage system for storing a dataset in a multi-tiered storage device. The multi-tiered storage device includes multiple storage tiers configured to store data, and each tier is associated with respective characteristics related to latency, economic cost, or other factors. In this example, the computing system receives one or more datasets along with access logs describing accesses to (e.g., queries against) the datasets. Based on the access logs, the computing system partitions each dataset into an initial set of data partitions and assigns a respective priority to each data partition. The priority of a data partition can be based on frequency or recency of access to the data partition. The computing system additionally merges certain data partitions with similar priorities and overlapping data to reduce duplication across the data partitions.

In this example, the computing system runs a compression predictor module, which inputs samples of the datasets. With the compression predictor module, the computing system compresses each sample using multiple compression schemes and, as such, determines compression data describing the performance of each compression scheme as applied to each sample. The computing system uses a cost function that takes as input information about the data partitions and their respective priorities, the compression data, and information about the various tiers of the multi-tiered storage device. Specifically, for instance, the computing system minimizes this cost function to determine a respective compression scheme and a storage tier, within the multi-tiered storage device, for each data partition. The computing system then stores each data partition in the respective storage tier of the multi-tiered storage device using the respective compression scheme.

Certain embodiments described herein represent improvements in the technical field of data storage. In contrast to existing systems, embodiments of a storage system described herein seek to optimize a cost function to determine both compression schemes and storage tiers for various data partitions. The cost function can depend on compression performance, data priorities, and performance guarantees associated with certain data. As a result of performing this optimization, the cost of storing the dataset can be reduced overall, rather than simply for individual portions of data within the datasets. Further, the storage system can support the use of multiple compression schemes at once, which can be beneficial given that a single compression scheme might perform well on some types of data but not others. In short, embodiments of a storage system described herein can reduce storage costs while maintaining low latency and can do so while enforcing performance guarantees.

As used herein, the term "data partition" or "partition" refers to a portion of dataset that has been divided into multiple parts. In some embodiments, a data partition includes a proper subset of a larger dataset.

As used herein, the term "compression scheme" refers to a technique for compressing data, including definitions of nay parameters needed to perform the technique. A compression scheme can define how to perform a certain type of compression with enough specificity such that a storage system described herein can perform the compression on a data partition.

As used herein, the term "compression data" refers to a set of data describing performance characteristics of one or more compression schemes. For instance, compression data may indicate a compression ratio and a decompression time of applying each of multiple compression schemes to each of multiple samples of a dataset.

As used herein, the term "multi-tiered storage device" refers to a storage device that includes multiple storage tiers, or layers, suitable for storing data partitions. For instance, each storage tier includes a computer-readable medium, or a portion thereof, for storing data. In some embodiments, a given storage tier may be associated with different cost and performance characteristics as compared to other storage tiers of the multi-tiered storage device.

As used herein, the term "data extractor module" refers to hardware, software, or a combination of hardware and software configured to extract samples from a dataset. For instance, the data extractor module may randomly select samples from the dataset, and those samples may then be used to test compression schemes on the dataset.

As used herein, the term "data partitioner module" refers to hardware, software, or a combination of hardware and software configured to partition a dataset into data partitions. In some embodiments, the data partitions can then be stored in a multi-tiered storage device.

As used herein, the term "compression predictor module" refers to hardware, software, or a combination of hardware and software configured to apply multiple compression schemes to samples of a dataset. In some embodiments, the compression predictor module is further configured to generate compression data, based on the application of the multiple compression schemes, describing performance of the compression schemes.

As used herein, the term "optimization engine" refers to hardware, software, or a combination of hardware and software configured to determine respective compression schemes and storage tiers for various data partitions of a dataset. In some embodiments, the optimization engine optimizes a cost function to determine the compression schemes and storage tiers for the data partitions.

At used herein, the term "storage manager module" refers to hardware, software, or a combination of hardware and software configured to store data partitions in a multi-tiered storage device. In some embodiments, the storage manager module applies compression schemes to data partitions as indicated by the optimization engine and stores compressed data partitions in storage tiers as indicated by the optimization engine.

Example of a Storage System for a Multi-Tiered Storage Device

FIG. 1 is a diagram of an example of a storage system 100 configured to manage store data or determine storage schemes for storing data in a multi-tiered storage device 110 with compression, according to some embodiments described herein. In some embodiments, the storage system 100 is a computer system configured to analyze a dataset and access patterns of the dataset and, as a result, to store data partitions of the dataset according to determined parameters. In some embodiments, the storage system 100 is implemented as one or more computing devices running program code to perform operations described herein. For instance, the storage system 100 includes program code running on one or more computing nodes of a cloud computing environment, such that services of the storage system 100 and datasets stored in the storage system 100 are accessible by one or more clients 120 to enable users of the one or more clients 120 access those datasets.

As shown in FIG. 1, the storage system 100 may include, or have access to, a multi-tiered storage device 110 for maintaining stored data from one or more datasets 180. The storage system 100 may also include a dataset extractor module 130, a data partitioner module 140, a compression predictor module 150, an optimization engine 160, and a storage manager module 170. Each of the multi-tiered storage device 110, the dataset extractor module 130, the data partitioner module 140, the compression predictor module 150, the optimization engine 160, and the storage manager module 170 may be implemented as hardware, software, or a combination of both. For example, the multi-tiered storage device 110 may be implemented as one or more computer-readable media, and each of the dataset extractor module 130, the data partitioner module 140, the compression predictor module 150, the optimization engine 160, and the storage manager module 170 may be implemented as program code executable to cause a processing unit to perform the operations described herein. Although the multi-tiered storage device 110, the dataset extractor module 130, the data partitioner module 140, the compression predictor module 150, the optimization engine 160, and the storage manager module 170 are shown in FIG. 1 as being distinct, this distinction is for illustrative purposes only, and these components may share hardware, software, or a combination of both.

A dataset 180 operated on or stored by the storage system 100 can take various forms. Generally, a dataset 180 utilized as described herein can be a collection of data. For instance, a dataset 180 can maintain information describing financial transactions, flight data, residential information, business transactions, web activity, purchase transactions, or various other data. In some embodiments, the dataset 180 is stored in one or more databases, database tables, text files, other storage objects, or a combination of these. For example, the dataset 180 may be stored in a SQL database or one or more SQL database tables. In some embodiments, a dataset 180 includes one or more database tables or portions of one or more database tables. In that case, a data partition, also referred to herein as a partition, of the dataset 180 may be a subset of the rows or columns of one or more database tables. Various implementations are possible and are within the scope of this disclosure.

The multi-tiered storage device 110 may be a device, which may include multiple sub-devices, configured to store data. For instance, the multi-tiered storage device 110 includes one or more computer-readable media suitable for storing data, specifically data partitions of a dataset. A computer-readable medium of the multi-tiered storage device 110 may be non-transitory and can include one or more electronic, optical, magnetic, or other storage devices. Non-limiting examples of a computer-readable medium include a magnetic disk, a memory chip, a ROM, a RAM, an ASIC, optical storage, magnetic tape or other magnetic storage, or any other medium from which a computer processing unit can read data and to which a computer processing unit can write data. In some embodiments, the multi-tiered storage device 110 includes two or more portions of computer-readable media with varying characteristics. The portions may be part of a common computer-readable medium or multiple computer-readable media.

In some embodiments, each tier of the multi-tiered storage device 110 is associated with performance characteristics. As a result of the varying performance characteristics, a first tier may be associated with a different latency or economic cost than a second tier of the multi-tiered storage device 110. For instance, a particular tier may be associated with a higher read rate than other tiers, such as due to higher throughput of the computer-readable medium used for the particular tier, but as a tradeoff, the particular tier may be associated with a higher economic cost. For another example, a particular tier may be associated with a relatively low economic cost but may be associated with high latency due to a low read rate. Various implementations are possible and are within the scope of this disclosure.

In some embodiments, the storage system 100 receives one or more datasets 180 and stores the one or more datasets 180 in the multi-tiered storage device 110, such that data in the one or more datasets 180 is accessible to clients 120 or other devices. As described below, various components of the storage system 100 facilitate this storage and access by determining storage schemes for data partitions of a dataset 180.

In some embodiments, the dataset extractor module 130 receives data from datasets 180 as well as access logs 190 (e.g., query logs). The access logs 190 may describe queries run against the dataset 180 or other accesses to the dataset 180, such as by clients 120 or other devices. The dataset extractor module 130 may mine the access logs 190 to extract individual datasets 180 and metadata describing those datasets 180, and the dataset extractor module 130 may provide each dataset 180 and associated metadata to the data partitioner module 140. The dataset extractor module 130 may also extract from the dataset 180 samples of data (e.g., random samples) of the datasets 180 and may provide such samples to the compression predictor module 150, with each sample being tagged as associated with the dataset 180 from which the sample was extracted.

The data partitioner module 140 may input the datasets 180 and access logs 190 and, from this input, may partition each dataset 180 and determine a respective priority for each data partition of the dataset 180. In some embodiments, the data partitioner module 140 partitions each dataset 180 based on the access logs 190. For instance, the data partitioner module 140 creates a partition corresponding to each subset of the dataset 180 accessed in entries of the access logs 190. This could result in data partitions with overlapping data, however, and as such, the data partitioner module 140 may also merge certain data partitions to perform deduplication. In some embodiments, the data partitioner module 140 also assigns a priority to each resulting data partition based on access patterns indicated in the access logs 190. The merging and priority determination of data partitions are described in more detail later in this disclosure.

In some embodiments, the compression predictor module 150 receives, from the data partitioner module 140, samples of the dataset 180. The compression predictor module 150 may be configured to apply multiple compression schemes. Each compression scheme defines a specific compression algorithm with enough specificity to enable the compression predictor module 150 to perform the corresponding compression on a sample. Examples of compression schemes include gzip, lz4, and QuickLZ. In general, two different compression schemes applied to the same sample of data could yield two different sets of compressed data. The compression predictor module 150 may apply each compression scheme to a given sample of a dataset 180 to determine compression data describing the performance of each such compression. For instance, the compression data could indicate a compression ratio and a decompression time of each compression scheme as applied to each sample. The compression data may be used by the optimization engine 160 to determine how to the data partitions of the dataset 180.

The optimization engine 160 may receive, from the data partitioner module 140, indications of the data partitions and corresponding priorities and, from the compression predictor module 150, the compression data. In some embodiments, the optimization engine 160 uses these inputs to determine a respective storage scheme for each data partition, where a storage scheme indicates a storage tier and compression scheme. Operations involved in making this determination in some embodiments are described in more detail later in this disclosure. The optimization engine 160 may provide the storage scheme for each data partition to the storage manager module 170.

In some embodiments, the storage manager module 170 has access to the multi-tiered storage device 110 and is configured to compress and decompress data. The storage manager module 170 may receive, from the data partitioner module 140 or from the optimization engine 160, indications of the various data partitions and, from the optimization engine 160, a respective storage scheme for each data partition. For each data partition, the storage manager module 170 may apply the compression scheme indicated in the corresponding storage scheme to produce a compressed data partition; the storage manager module 170 may then store the compressed data partition in the multi-tiered storage device 110, specifically, in the storage tier indicated in the storage scheme. When access to a data partition is requested, such as by a client 120, the storage manager module 170 may read the compressed data partition from the storage tier of the multi-tiered storage device 110, decompresses the compressed data partition to retrieve the data partition, and transmit the data partition to the requestor.

A client 120 may be a computing device or a portion of a computing device configured to access data in a cloud, where that cloud includes the multi-tiered storage device 110 as managed by the storage system 100 described herein. In some examples, the client 120 is or includes an application, such as a web application, configured to provide an interface for interactions with the storage system 100. A user of the client 120 can operate the client 120 to access data in the multi-tiered storage device 110, such as for the purpose of analyzing that data to discover insights. To enable that access, upon request from the client 120, the storage manager module 170 may read data from the multi-tiered storage device 110 and return that data to the client 120. One or multiple clients 120 may be communication with the storage system 100 to enable access to the storage system 100 for one or multiple human or automated users at a given time. Various implementations are possible and are within the scope of this disclosure.

Figure 2:
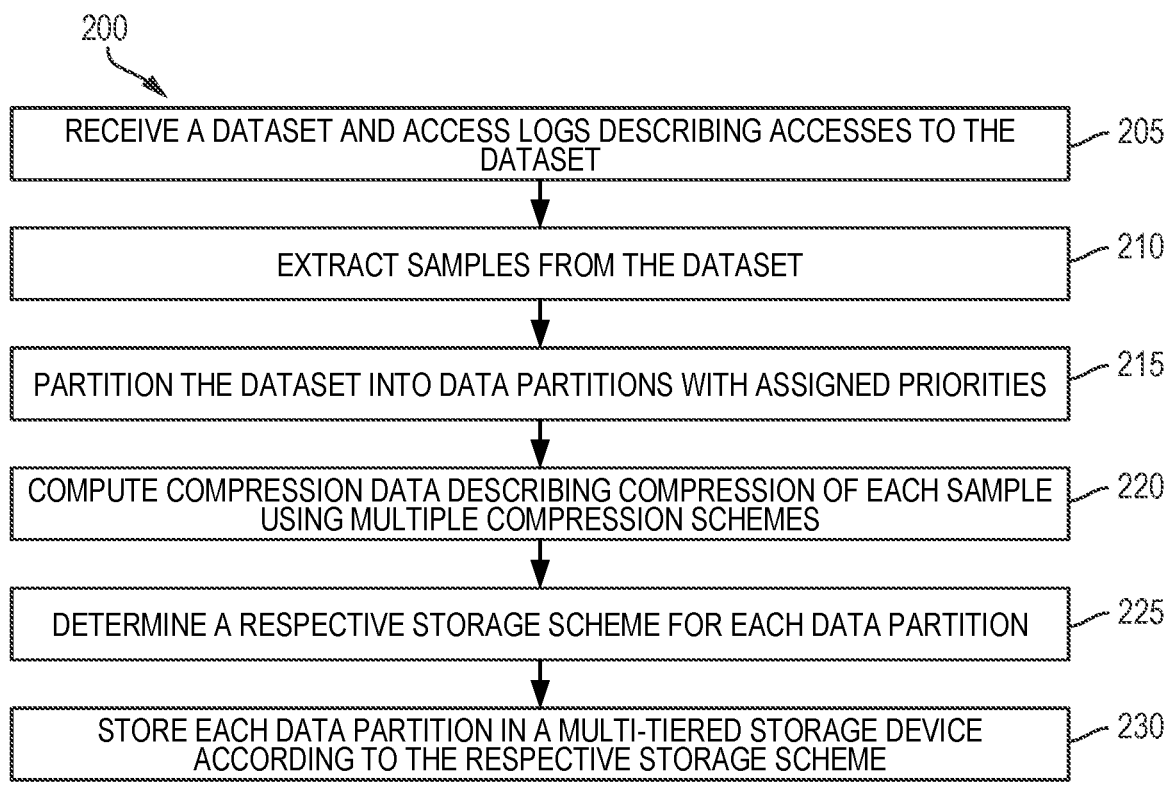
FIG. 2 is a flow diagram of an example of a process for storing data in the multi-tiered storage device, according to some embodiments described herein.

FIG. 2 is a flow diagram of an example of a process 200 for storing data in the multi-tiered storage device 110, according to some embodiments described herein. The process 200 depicted in FIG. 2 may be implemented in software executed by one or more processing units of a computing system, implemented in hardware, or implemented as a combination of software and hardware. This process 200 is intended to be illustrative and non-limiting. Although FIG. 2 depicts various processing operations occurring in a particular order, the particular order depicted is not required. In certain alternative embodiments, the processing may be performed in a different order, some operations may be performed in parallel, or operations may be added, removed, or combined together. In some embodiments, this process 200 or similar is performed by the storage system 100 and, more specifically, by a combination of the dataset extractor module 130, the data partitioner module 140, the compression predictor module 150, the optimization engine 160, and the storage manager module 170. In some embodiments, the process 200 may be performed once or multiple times (e.g., periodically) to update the storage schemes of data partitions as access patterns change over time. For instance, an example of the storage system 100 performs this process 200 or similar on a monthly basis.

As shown in FIG. 2, at block 205, the process 200 involves receiving a dataset 180 and access logs 190 describing accesses to the dataset 180. For instance, the dataset extractor module 130 may receive the dataset 180 and access logs 190. The dataset 180 and access logs 190 may be provided to the dataset extractor module 130 by an administrator or provided automatically, such as through an application programming interface (API) connecting the storage system 100 to one or more data sources.

At block 210, the process 200 involves extracting samples from the dataset. For instance, the dataset extractor module 130 may randomly sample the dataset 180 and may provide each sample to the compression predictor module 150.

At block 215, the process 200 involves partitioning the dataset 180 into data partitions and assigning each data partition a respective priority. In some embodiments, the data partitioner module 140 performs this operation by dividing the dataset 180 into initial partitions with respective priorities and then merging some of such initial partitions to form an updated set of data partitions. An example process of this dividing and merging is described in detail below with reference to FIG. 3.

At block 220, the process 200 involves computing compression data describing the performance of multiple compression schemes as applied to each sample of the dataset extracted at block 210. In some embodiments, the compression predictor module 150 computes the compression data. An example process for computing the compression data is described in detail below with reference to FIG. 4.

At block 225, the process 200 involves determining a respective storage scheme for each data partition determined at block 215, using the compression data determined at block 220. In some embodiments, to this end, the optimization engine 160 takes as input indications of the data partitions and their respective priorities as well as the compression data and determines an optimal solution that assigns a storage tier and compression scheme to each data partition. An example process for determining a respective storage scheme for each data partition is described in detail below with reference to FIG. 5.

At block 230, the process 200 involves storing each data partition in the multi-tiered storage device 110 according to the respective storage scheme determined at block 225. Specifically, for instance, the storage manager module 170 reads the storage scheme of a particular data partition to determine the compression scheme and the storage tier assigned to (i.e., determined for) the data partition. The storage manager module 170 compresses the data partition according to the compression scheme to produce a compressed data partition and stores the compressed data partition in the storage tier. In some embodiments, not all data partitions are compressed, and in that case, the optimization engine 160 may indicate a default compression scheme or null compression scheme for a data partition that the optimization engine 160 determines should not be compressed. In that case, the storage manager module 170 may skip the compression operation when storing that data partition, or the storage manager module 170 may apply a compression operation that simply outputs its input. Various implementations are possible and are within the scope of this disclosure.

Example of Partitioning a Dataset for Storage

Figure 3:
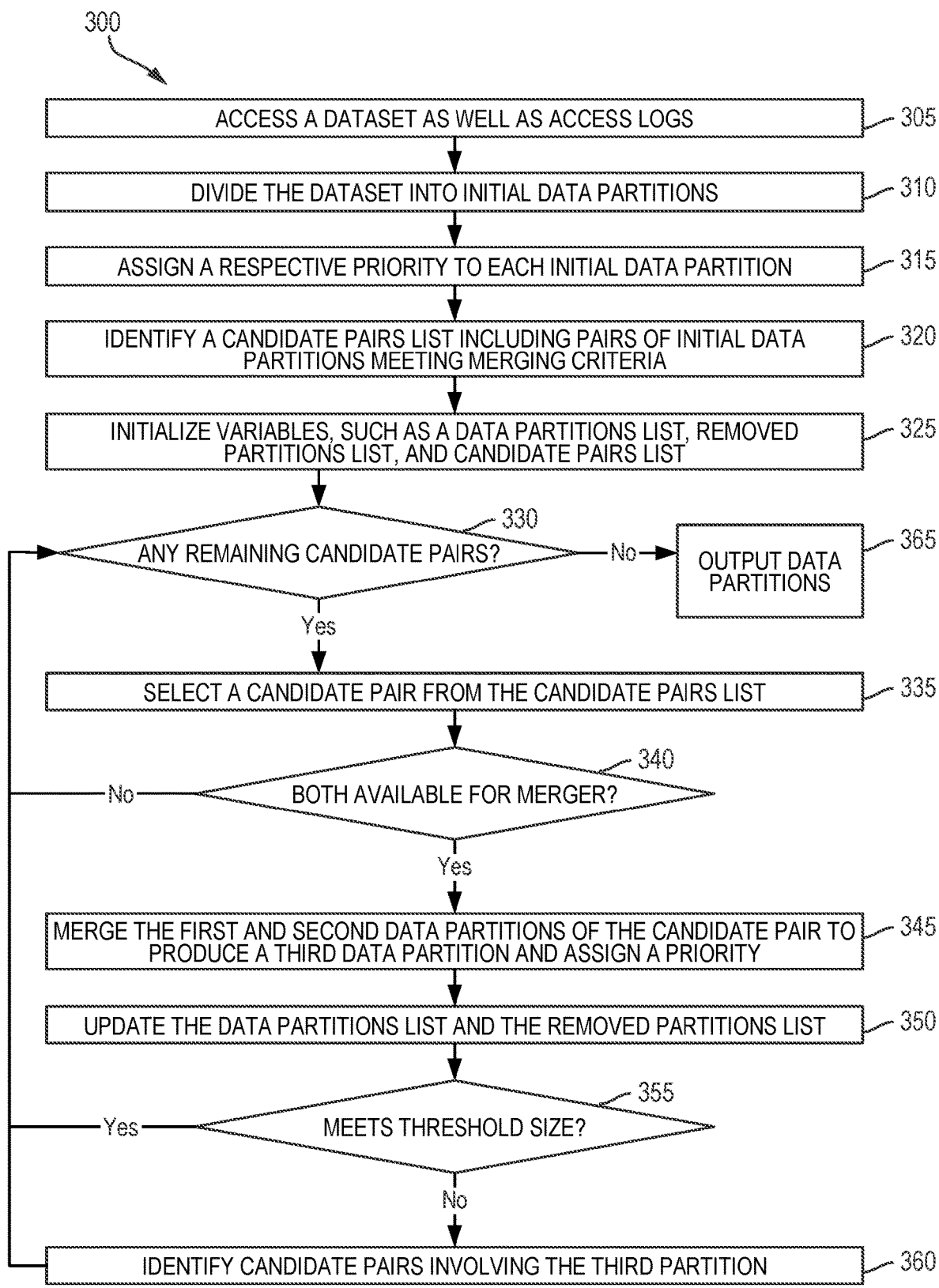
FIG. 3 is a flow diagram of an example of a process for partitioning a dataset for storage, according to some embodiments described herein.

FIG. 3 is a flow diagram of an example of a process 300 for partitioning a dataset 180, according to some embodiments described herein. The process 300 depicted in FIG. 3 may be implemented in software executed by one or more processing units of a computing system, implemented in hardware, or implemented as a combination of software and hardware. This process 300 is intended to be illustrative and non-limiting. Although FIG. 3 depicts various processing operations occurring in a particular order, the particular order depicted is not required. In certain alternative embodiments, the processing may be performed in a different order, some operations may be performed in parallel, or operations may be added, removed, or combined together. In some embodiments, this process 300 or similar is performed at block 215 of the above process 200 by the data partitioner module 140. In some embodiments, the process 300 is performed for each dataset 180 each time the above process 200 runs.

As shown in FIG. 3, at block 305, the process 300 involves accessing a dataset 180 and access logs 190 describing accesses to the dataset 180. For instance, the access logs 190 may indicate a time of each access (e.g., each query against the dataset 180) as well as the data returned in response to each access. In some embodiments, the data partitioner module 140 receives the dataset 180 and the access logs 190 from the dataset extractor module 130.

At block 310, the process 300 involves dividing the dataset 180 into data partitions that act as initial data partitions. In some embodiments, the data partitioner module 140 partitions the dataset 180 based on the access logs 190. Various partitioning schemes are possible and are within the scope of this disclosure. For instance, the data partitioner module 140 generates an initial data partition for each set of data returned in response to an access, according to the access logs 190. This may result in some data being included in multiple initial data partitions, such that some initial data partitions overlap. Any remaining data of the dataset 180, such as data not returned in a response to an access, may be placed in further initial data partitions such that each further initial data partition is no more than a fixed size. As described below, some of these initial data partitions may be merged to form merged data partitions, and thus, not all data partitions generated at block 310 need be output by the data partitioner module 140 to the optimization engine 160.

At block 315, the process 300 involves assigning a respective priority to each initial data partition determined at block 310. In some embodiments, the data partitioner module 140 applies a priority function to each data partition to determine the priority of the data partition. The priority function may be a function of one or more of the following: frequency of access to the data partition as described in the access logs 190, recency of access to the data partition as described in the access logs 190, access times, and the quantity of references to data in the data partition according to the access logs 190. In one example, the data partitioner module 140 uses the following priority function to compute $p_n$, the priority of the $n^{th}$ data partition:

$$p_n = \sum_{i=1}^{f_n} e^{-\frac{1}{r_n}(t-t_{ni})}$$

In the above formula, $f_n$ is the frequency of access $n^{th}$ data partition according to the access logs 190; $t_{ni}$ is the time of the $i^{th}$ access to the $n^{th}$ data partition according to the access logs 190; $r_n$ is the number of references to the $n^{th}$ data partition in the access logs; and t is the current time. As described above, the initial data partitions may be generated based on the access logs, and thus, in some embodiments, the data within a given initial data partition has been accessed together and may therefore be assigned a common priority. However, in some embodiments, each access to data in a data partition may be deemed an access to the data partition as a whole, for the purpose of determining priority.

At block 320, the process 300 involves identifying a candidate pairs list for potential mergers among the initial data partitions determined at block 310. In some embodiments, a candidate pair is a pair of data partitions, such as a pair of initial data partitions, meeting merging criteria. To identify the candidate pairs, the data partitioner module 140 can check each pair of initial data partitions determined at block 310 to determine which pairs meet the merging criteria. For instance, the data partitioner module 140 tests every possible pair, which is a set of pairs of N(N−1) for N initial data partitions. The merging criteria can be, for example, a requirement that both data partitions of the pair have the same priority, or priorities within a threshold priority range of each other, and that the size of overlapping data between the two data partitions is at least a threshold overlap size. For instance, the overlap size of a pair of data partitions could be defined as the percentage of the size of the overlapping data as compared to the sum of the sizes of the two data partitions. Thus, for instance, a first data partition and a second data partition could meet the meet the merging criteria if the first data partition and the second data partition were assigned the same priority at block 315 and have an overlap of 25%, which is greater than or equal to the threshold overlap size.

The data partitioner module 140 may add, to the candidate pairs list, each pair of initial data partitions meeting the merging criteria. The candidate pairs list can be implemented in various ways. For instance, the candidate pairs list may be implemented a heap, a stack, or a linked list (e.g., a last-in-first-out (LIFO) list) of candidate pairs. Below, the candidate pairs list is described as a heap, but this is for illustrative purposes only. Other implementations are possible and are within the scope of this disclosure. In some embodiments, if a heap is being used to represent the set of candidate pairs, then the data partitioner module 140 may push onto the heap an indication of each candidate pair of initial data partitions meeting the merging criteria.

At block 325, the process 300 involves initializing variables to use in determining an updated set of data partitions. These variables may include a data partitions list, a removed partitions list, and a candidate pairs list. The data partitioner module 140 may initialize the data partitions list to include the initial data partitions determined at block 310. The data partitioner module 140 may initialize the removed partitions list to be an empty set used to indicate data partitions that are no longer available to be merged with other data partitions, as described in more detail below.

Decision block 330 begins an iterative loop in which candidate pairs of data partitions are considered for merging. During the iterative loop, the data partitioner module 140 may merge certain data partitions and, as such, remove the remaining candidate pairs including those data partitions from consideration. To track these operations, the data partitioner module 140 may utilize the heap of candidate pairs and, additionally, a list of removed data partitions. The removed data partitions list may be initialized as an empty set. The removed data partitions are data partitions that have already been merged and are thus no longer part of candidate pairs for merging; however, a data partition resulting from a merge of two data partitions may be added to the candidate pairs and considered for further merger.

At decision block 330, the process 300 involves determining whether any candidate pairs are in the candidate pairs list. If the candidate pairs list is empty, then the process 300 can output the data partitions list at block 365. Specifically, for instance, the data partitioner module 140 outputs to the optimization engine 160 indications of the data partitions in the data partitions list along with corresponding priorities. If there is at least one candidate pair on the candidate list, however, the process 300 proceeds to block 335. At block 335, the process 300 involves selecting a candidate pair from the set of candidate pairs. The candidate pair includes a first data partition and a second data partition for which the merging criteria were met, and the data partitioner module 140 may remove the candidate pair from the candidate pairs list.

In some embodiments, to select the candidate pair, the data partitioner module 140 pops a candidate pair of data partitions off the heap.

At decision block 340, the process 300 involves determining whether both the first data partition and the second data partition are still available to be merged. For instance, in some embodiments, the data partitioner module 140 makes this determination by checking whether either of the first data partition or the second data partition is on the removed data partitions list. If neither is on the removed data partitions list, then both the first data partition and the second data partition are available to be merged. In that case, the process 300 continues at block 345. However, if either one or both of the first data partition and the second data partition are no longer available to be merged (e.g., as indicated by inclusion on the removed partitions list), then in some embodiments, the current candidate pair will not be merged and the process 300 returns to decision block 330 to select another candidate pair, if available.

If both the first data partition and the second data partition are available to be merged, then at block 345, the process 300 involves merging the first data partition and the second data partition and assigning a priority to the resulting third data partition. For instance, to perform the merger, the data partitioner module combines the data from the first data partition and the data from the second data partition into a third data partition, which includes only a single copy of the overlapping data between the first data partition and the second data partition. Thus, in some embodiments, the third data partition resulting from the merger is smaller than the sum of the first data partition and the second data partition. In some embodiments, the data partitioner module 140 assigns to the third data partition a priority based on the respective priorities of the first data partition and the second data partition; for instance, the priority of the third data partition can be an average (e.g., the mathematical mean) of the respective priorities of the first data partition and the second data partition.

At block 350, the process 300 involves updating the data partitions list and the removed partitions list. For instance, the data partitioner module 140 adds the third data partition to the data partitions list, removes the first data partition and the second data partition from the data partitions list, and adds the first data partition and the second data partition to the removed data partitions list. The first and second data partitions have already been merged and, in some embodiments, are therefore no longer individual data partitions for output (i.e., in the data partitions list) and are also no longer available as individual data partitions for merging.

At decision block 355, the process 300 involves determining whether the third data partition, as generated at block 345, meets a size threshold. In some embodiments, the size threshold indicates a maximum size allowed for data partitions available for merger. If the third data partition meets the size threshold (e.g., is greater than or equal to the size threshold), then the process 300 returns to decision block 330 to select another candidate pair, if available. However, if the third data partition does not meet the size threshold (e.g., is less than the size threshold), then the process 300 proceeds to block 360.

At block 360, the process 300 involves identifying candidate pairs that include the third data partition resulting from the merger at block 345. For instance, the data partitioner module 140 pairs the third data partition with each other data partition in the data partition list and test each such pair against the merging criteria. The data partitioner module 140 may add, to the candidate pairs list, each pair of data partitions including the third data partition and meeting the merging criteria. The process 300 then returns to decision block 330 to select another candidate pair, if available. If no more candidate pairs are available, then the process 300 can output the data partitions list at block 365.

In some embodiments, merging partitions, such as in the manner described above, can keep improve efficiencies of storing the data partitions. Each merged data partition is typically smaller than the data partitions combined in the merger, and the act of merging reduces duplication. As a result, merging can reduce the economic cost of storage by taking up less space and can also reduce latency because the chunks of data being read (i.e., the merged data partitions) are smaller due to the removal of duplicate (i.e., overlapping) data.

Example of Determining Compression Data to Facilitate Storage

Figure 4:
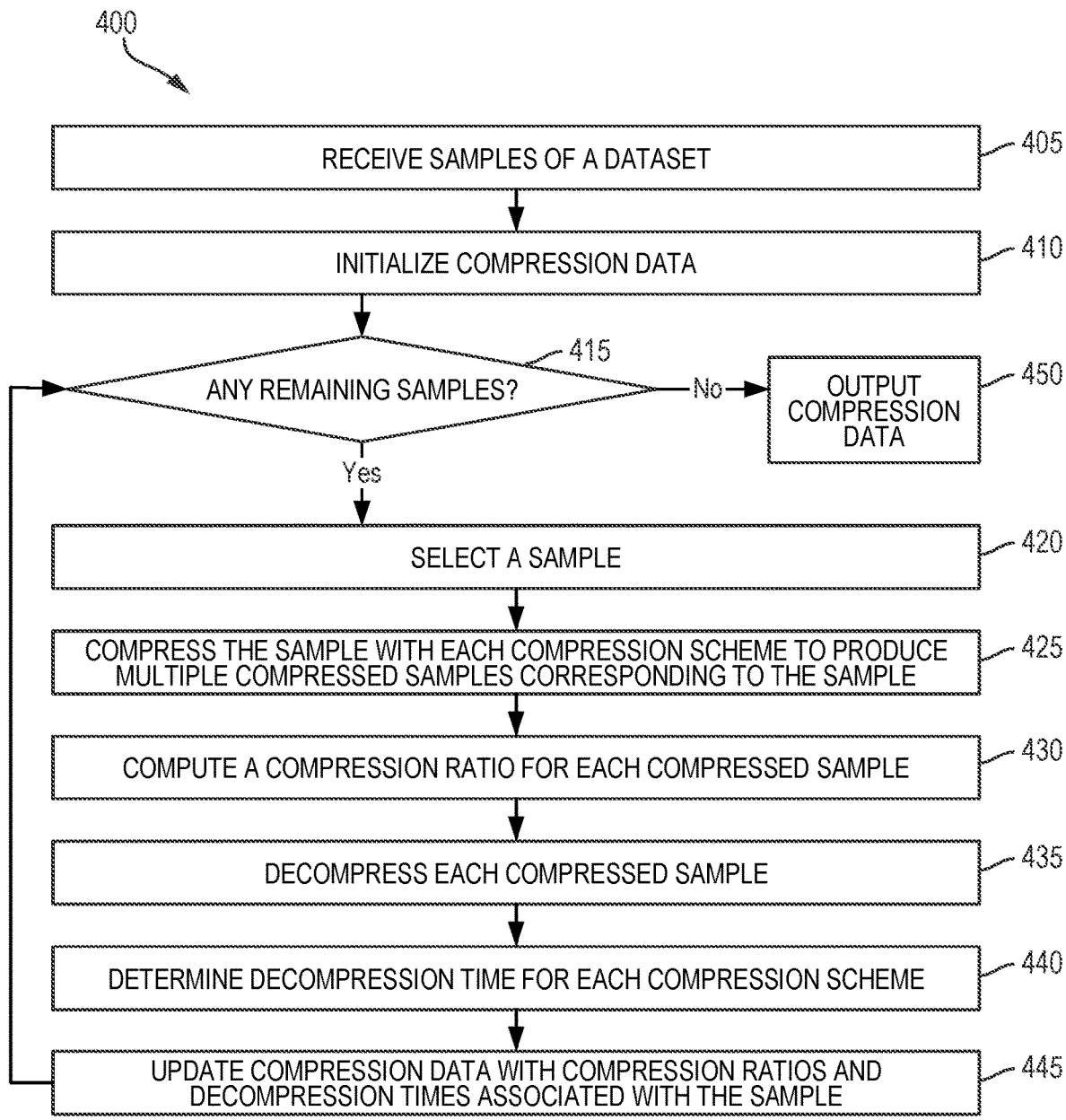
FIG. 4 is a flow diagram of an example of a process for determining compression data for use in determining storage schemes for the data partitions, according to some embodiments described herein.

FIG. 4 is a flow diagram of an example of a process 400 for determining compression data for use by the optimization engine 160 to determine storage schemes, according to some embodiments described herein. The process 400 depicted in FIG. 4 may be implemented in software executed by one or more processing units of a computing system, implemented in hardware, or implemented as a combination of software and hardware. This process 400 is intended to be illustrative and non-limiting. Although FIG. 4 depicts various processing operations occurring in a particular order, the particular order depicted is not required. In certain alternative embodiments, the processing may be performed in a different order, some operations may be performed in parallel, or operations may be added, removed, or combined together. In some embodiments, this process 400 or similar is performed at block 220 of the above process 200 by the compression predictor module 150. In some embodiments, the process 400 is performed for samples of each dataset 180 each time the above process 200 runs.

As shown in FIG. 4, at block 405, the process 400 involves access samples received from the dataset extractor module 130. As described above, in some embodiments, the dataset extractor module 130 extracts samples from one or more datasets 180 and provides those samples to the compression predictor module 150. At block 410, the process 400 involves initializing compression data. As described further below, the compression data includes information describing the performance of compression schemes applied to the samples of datasets 180. To initialize the compression data, the compression predictor module 150 may, for instance, erase the compression data or set the compression data equal to an empty set. Decision block 415 begins an iterative loop in which the compression predictor module 150 tests compression schemes on the samples accessed at block 405. To this end, at decision block 415, the process 400 involves determining whether any samples remain to be tested. If no samples remain, then at block 450, the compression predictor module 150 may output the compression data generated. In some embodiments, the compression data describes, or represents, the performance of each of multiple compression schemes on each of one or more datasets 180. For instance, for a given dataset 180 and a given compression scheme, the compression data may include average values of compression ratios and decompression times of applying the given compression scheme to samples taken from the given dataset 180. As described in more detail below, in some embodiments, the optimization engine 160 uses the compression data to determine storage schemes for the data partitions determined by the data partitioner module 140.

At block 420, the process 400 involves selecting a sample that remains to be tested. At block 425, the process 400 involves compressing the sample with each of multiple compression schemes, resulting in multiple compressed samples corresponding to the sample. At block 430, the process 400 involves computing a respective compression ratio for each compressed sample. For instance, the compression ratio is the ratio of the size of the compressed sample divided by the size of the sample. The compression ratio may vary across compressed samples due to the use of varying compression schemes. At block 435, the process 400 involves decompressing each compressed sample, and at block 440, the process 400 involves determining the decompression time for each such decompression. For instance, the compression predictor module 150 may decompress each compressed sample one at a time, while keeping a clock to track the time from initiating the decompression to the completion of the decompression.

At block 445, the process 400 involves updating the compression data to indicate the results of compressing and decompressing the sample. For instance, the compression predictor module 150 may estimate the compression data associated with the dataset 180 from which the sample was taken to update, for each compression scheme applied to the sample, the average compression ratio and the average decompression time for application of that compression scheme to the dataset 180, based on the compression ratio and the decompression time determined for the sample. In some embodiments, other characteristics of the performance of each compression scheme may be stored in the compression data as well. The process 400 then returns to decision block 415 to select another sample, if available. If no more samples remain for testing, then the process 400 can output the compression data at block 450.

Example of Determining Storage Schemes for Data Partitions

Figure 5:
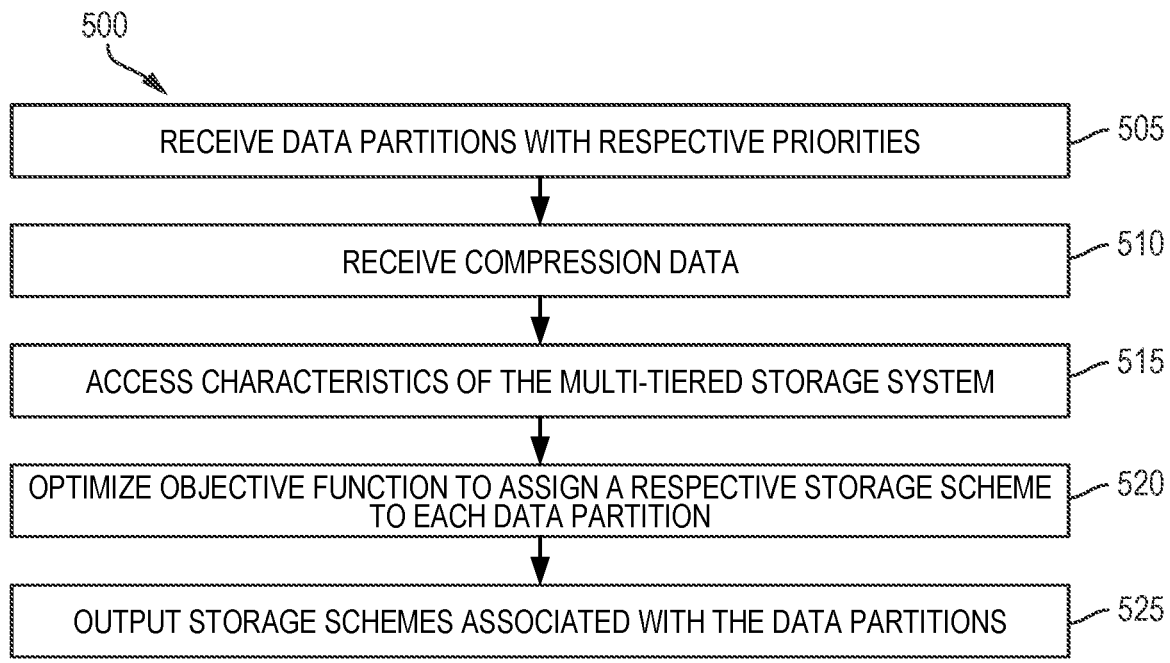
FIG. 5 is a flow diagram of an example of a process for determining a respective storage scheme for each data partition, according to some embodiments described herein.

FIG. 5 is a flow diagram of an example of a process 500 for determining a respective storage scheme for each data partition, according to some embodiments described herein. The process 500 depicted in FIG. 5 may be implemented in software executed by one or more processing units of a computing system, implemented in hardware, or implemented as a combination of software and hardware. This process 500 is intended to be illustrative and non-limiting. Although FIG. 5 depicts various processing operations occurring in a particular order, the particular order depicted is not required. In certain alternative embodiments, the processing may be performed in a different order, some operations may be performed in parallel, or operations may be added, removed, or combined together. In some embodiments, this process 500 or similar is performed at block 225 of the above process 200 by the optimization engine 160. In some embodiments, the process 500 is performed for each dataset 180 each time the above process 200 runs.

As shown in FIG. 5, at block 505, the process 500 involves accessing indications of data partitions and corresponding priorities received from the data partitioner module 140. At block 510, the process 500 involves accessing the compression data received from the compression predictor module 150. At block 515, the process 500 involves accessing performance requirements, if any, and storage data describing characteristics of the multi-tiered storage device 110. For instance, the performance requirements are defined by an administrator in accordance with contractual obligations or quality-of-service requirements. In some embodiments, a performance requirement indicates a maximum allowable latency for certain portions of data. In some embodiments, the optimization engine 160 applies a performance requirement to each data partition that includes any portion of data to which the performance requirement is applicable. Additionally, for instance, the storage data indicates the following information: number of storage tiers, economic cost of each storage tier, capacity of each storage tier, read latency of each storage tier, read cost of each storage tier (e.g., a measure of computing resources used to read from the storage tier), and cost of an archive layer. The storage data may be provided by an administrator or detected through testing the multi-tiered storage device 110, for instance.

At block 520, the process involves optimizing a cost function (i.e., solving an optimization for the cost function) to determine a respective storage scheme for each data partition. A storage scheme includes, for instance, a storage tier and a compression scheme. Specifically, in some embodiments, the optimization engine 160 minimizes the following cost function to determines the storage schemes for the data partitions:

$$\sum_{m=1}^{M}\sum_{n=1}^{N}\sum_{k=1}^{K}\left[\alpha * c_m \frac{s_n}{\eta_{k,n}} + \gamma * p_n\left(c^{(c)}\eta_{k,n} + c_m^{(r)}\frac{s_n}{\eta_{k,n}}\right)\right]x_{mnk} +$$

$$\beta * \sum_{n=1}^{N}\left[c^{(a)}s_n p_n\left(1 - \sum_{m=1}^{M}\sum_{k=1}^{K}x_{mnk}\right)\right]$$

In some embodiments, the above minimization is subject to the following constraints, which are respectively a feasibility constraint, a capacity constraint, and a latency constraint:

Feasibility Constraint:

$$\sum_{m=1}^{M}\sum_{k=1}^{K}x_{mnk} \le 1, n \in N = \{1, \ldots, N\}$$

Capacity Constraint:

$$\sum_{n=1}^{N}\sum_{k=1}^{K}\frac{s_n}{\eta_{k,n}}x_{mnk} \le C_m^{(lim)}, m \in M = \{1, \ldots, M\}$$

Latency Constraint:

$$\sum_{m=1}^{M}\sum_{k=1}^{K}(\mu_{k,n} + l_m^{(r)})x_{mnk} \leq \frac{l_n^{(lim)}}{p_n}, n \in N = \{1, \ldots, N\}$$

Upon optimizing the above cost function, the values of $x_{mnk}$ indicate the respective storage schemes of the data partitions in some embodiments. For instance, each $x_{mnk}$ has a value of 1 if the $n^{th}$ data partition is to be stored in the $m^{th}$ storage tier with the $k^{th}$ compression scheme, and $x_{mnk}$ has a value of 0 otherwise. The following table, TABLE 1, defines the remaining variables used in the above formulas.

TABLE 1

| Variable | Definition |
| --- | --- |
| M | number of storage tiers in the multi-tiered storage device, as indicated in the storage data |
| $c_m$ | cost of the $m^{th}$ storage tier per unit data, as indicated in the storage data |
| $c_m^{(lim)}$ | capacity of the $m^{th}$ storage tier, as indicated in the storage data |
| $l_m^{(r)}$ | read latency of the $m^{th}$ storage tier, as indicated in the storage data |
| $c_m^{(r)}$ | economic read cost (e.g., a cost paid to a cloud provider) of the $m^{th}$ storage tier, as indicated in the storage data |
| $c^{(a)}$ | economic cost (e.g., a cost paid to a cloud provider) of an archive tier, as indicated in the storage data |
| N | number of data partitions, as indicated by the data partitioner module |
| $s_n$ | size of the of the $n^{th}$ data partition, as indicated by the data partitioner module or as computed by the optimization engine |
| $p_n$ | size of the of the $n^{th}$ data partition, as indicated by the data partitioner module |
| $l_n^{(lim)}$ | maximum threshold latency for the $n^{th}$ data partition, as indicated by the performance requirements |
| n | |
| K | number of compression schemes, as indicated in the compression data |
| $\eta_{k,n}$ | compression ratio for the $k^{th}$ compression scheme applied to the $n^{th}$ data partition (e.g., applied to the dataset to which the $n^{th}$ data partition belongs), as indicated in the compression data |
| $\mu_{k,n}$ | decompression time per unit data for the $k^{th}$ compression scheme applied to the $n^{th}$ data partition (e.g., applied to the dataset to which the $n^{th}$ data partition belongs), as indicated in the compression data |
| $c^{(c)}$ | economic compute cost (e.g., a cost paid to a cloud provider) per second for decompression |
| $\alpha, \beta, \gamma$ | hyper-parameters used to weight corresponding terms of the cost function |

In the above cost function, the first term $$\left(c_m \frac{s_n}{\eta_{k,n}}\right)$$

represents storage cost in some embodiments. More particularly, the first term can represent a cost of storing a compressed data partition in various tiers, and the value of this first term can depend on the size of the compressed data partition. In some embodiments, the second term $$\left(p_n\left(c^{(c)}\eta_{k,n} + c_m^{(r)}\frac{s_n}{\eta_{k,n}}\right)\right)$$

represents latency cost. The second term above is the sum of decompression cost and latency cost of the data partitions weighted by their respective priorities. For the feasibility of this optimization, some embodiments utilize an inequality in the feasibility constraint, and as a result, some data partitions may not be assigned to any storage tier. This can be referred to as a "miss," and such data partitions may then be assigned to an archive tier, which may have a higher associated cost than other tiers of the multi-tiered storage device 110. To reduce the number of misses, the third term $$\left(\sum_{n=1}^{N}\left[c^{(a)}s_n p_n\left(1 - \sum_{m=1}^{M}\sum_{k=1}^{K}x_{mnk}\right)\right]\right)$$

in the cost function can penalize each miss. The capacity constraint can ensure that data stored in a storage tier does not exceed the capacity for that storage tier, and the latency constraint can ensure that decompression does not cause too much overhead in terms of latency. In some embodiments, the hyper-parameters $\alpha$, $\beta$, and $\gamma$ can be tuned (e.g., by an administrator) to prioritize storage cost, read cost, or the penalty associated with misses.

In some embodiments, such as in embodiments using the above formulas, the optimization is an integer linear program (ILP). Various techniques and facilities exist for solving an ILP, and the optimization engine 160 may use one or more of such techniques or facilities to optimize the above cost function or to otherwise determined the respective storage schemes of the data partitions. In some embodiments, the storage schemes may vary across data partitions. For instance, a first data partition may be assigned a different compression scheme and a different storage tier than a second data partition; a first data partition may be assigned the same compression scheme but a different storage tier than a second data partition; a first data partition may be assigned the same storage tier but a different compression scheme than a second data partition; or a first data partition may be assigned the same compression scheme and the same storage tier as a second data partition. Various combinations of storage schemes are possible across the various data partitions.

At block 525, the process 500 involves outputting, to the storage manager module 170, the storage schemes determined at block 520. In some embodiments, for instance, the optimization engine 160 outputs to the storage manager module 170 an indication of a respective storage scheme for each data partition. As described above, the storage manager module 170 may then store each data partition in the multi-tiered storage device 110 according to the respective storage scheme indicated by the optimization engine 160.

Example of a Computing System for Implementing Some Embodiments

Figure 6:
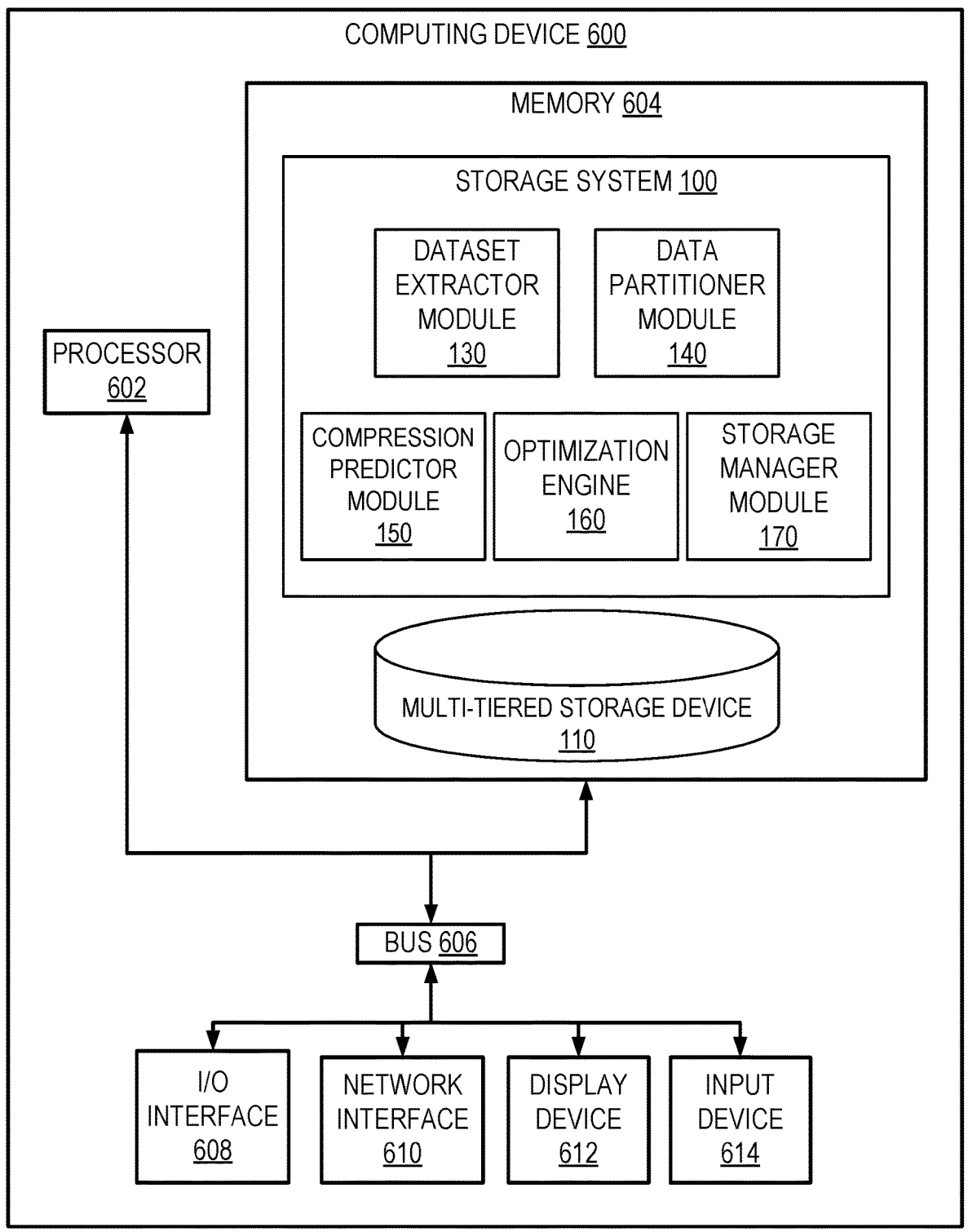
FIG. 6 is a diagram of an example of a computing system for performing certain operations described herein, according to some embodiments.

FIG. 6 is a diagram of an example of a computing system 600 for performing certain operations described herein, according to some embodiments. A suitable computing system or group of computing systems can be used for performing the operations described herein. For example, FIG. 6 depicts an example of a computing system 600 that can be used to execute the storage system 100 or various other aspects described herein. In some embodiments, as shown for instance, the computing system 600 executes the storage system 100 including the dataset extractor module 130, the data partitioner module 140, the compression predictor module 150, the optimization engine 160, and the storage manager module 170.

The depicted example of a computing system 600 includes a processor 602 communicatively coupled to one or more memory devices 604. The processor 602 executes computer-executable program code stored in a memory device 604, accesses information stored in the memory device 604, or both. Examples of the processor 602 include a microprocessor, an application-specific integrated circuit ("ASIC"), a field-programmable gate array ("FPGA"), or any other suitable processing device. The processor 602 can include any number of processing devices, including a single processing device.

The memory device 604 includes a suitable non-transitory computer-readable medium for storing data, program code, or both. A computer-readable medium can include an electronic, optical, magnetic, or other storage device capable of providing a processor with computer-readable instructions or other program code. Non-limiting examples of a computer-readable medium include a magnetic disk, a memory chip, a ROM, a RAM, an ASIC, optical storage, magnetic tape or other magnetic storage, or another medium from which a processing device can read instructions. The instructions may include processor-specific instructions generated by a compiler or an interpreter from code written in any suitable computer-programming language, including, for example, C, C++, C#, Visual Basic, Java, Python, Perl, JavaScript, and ActionScript.

The computing system 600 may also include a number of external or internal devices, such as input or output devices. For example, the computing system 600 is shown with one or more input/output ("I/O") interfaces 608. An I/O interface 608 can receive input from input devices or provide output to output devices. One or more buses 606 are also included in the computing system 600. The bus 606 communicatively couples one or more components of a respective one of the computing system 600.

The computing system 600 executes program code that configures the processor 602 to perform one or more of the operations described herein. The program code includes, for example, the dataset extractor module 130, the data partitioner module 140, the compression predictor module 150, the optimization engine 160, the storage manager module 170, or applications that perform one or more operations described herein. The program code may be resident in the memory device 604 or any suitable computer-readable medium and may be executed by the processor 602 or another suitable processor. In additional or alternative embodiments, program code for one or more of the dataset extractor module 130, the data partitioner module 140, the compression predictor module 150, the optimization engine 160, or the storage manager module 170 are stored in a different memory device of a different computing system.

The computing system 600 can access other models, datasets, or functions of the storage system 100 in any suitable manner. In some embodiments, some or all models, datasets, and functions used by the storage system 100 are stored in the memory device 604 of a computing system 600, as in the example depicted in FIG. 6. For instance, the multi-tiered storage device 110 may be resident on the computing system 600. In other embodiments, however, certain aspects of the storage system 100 are stored or executed on a separate computing system, which provides access to necessary models, datasets, and functions as needed, such as via a data network.

The computing system 600 also includes a network interface device 610. The network interface device 610 includes any device or group of devices suitable for establishing a wired or wireless data connection to one or more data networks. Non-limiting examples of the network interface device 610 include an Ethernet network adapter, a modem, and the like. The computing system 600 is able to communicate with one or more other computing devices (e.g., a separate computing device acting as a client 120) via a data network using the network interface device 610.

General Considerations

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provide a result conditioned on one or more inputs. Suitable computing devices include multi-purpose microprocessor-based computer systems accessing stored software that programs or configures the computing system from a general purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude the inclusion of such modifications, variations, and/or additions to the present subject matter as would be readily apparent to one of ordinary skill in the art.

The invention claimed is:

1. A method comprising:
assigning, to a data partition of a dataset, a priority based on access patterns of the data partition;
accessing compression data describing results of compressing a data sample associated with the data partition using multiple compression schemes;
determining, based both on the priority of the data partition and on the compression data, a storage tier for storing the data partition in a multi-tiered storage device;
determining, based both on the priority of the data partition and on the compression data, a compression scheme for compressing the data partition for storage in the multi-tiered storage device; and
compressing the data partition using the compression scheme to produce a compressed data partition and storing the compressed data partition in the storage tier.

2. The method of claim 1, further comprising:
assigning, to a second data partition of the dataset, a second priority based on access patterns of the second data partition;
accessing second compression data describing results of compressing a data sample associated with the second data partition using the multiple compression schemes;
determining, based both on the second priority of the second data partition and on the compression data, a second storage tier for storing the second data partition in the multi-tiered storage device, wherein the second storage tier differs from the storage tier;
determining, based both on the second priority of the second data partition and on the compression data, a second compression scheme for compressing the second data partition for storage in the multi-tiered storage device, wherein the second compression scheme differs from the compression scheme; and
compressing the second data partition using the second compression scheme to produce a compressed second data partition and storing the compressed second data partition in the second storage tier.

3. The method of claim 1, further comprising:
assigning, to a second data partition, a second priority based on access patterns of the second data partition;
accessing second compression data describing results of compressing a second data sample associated with the second data partition using the multiple compression schemes;
identifying, based both on the second priority of the second data partition and on the compression data, the storage tier for storing the second data partition in the multi-tiered storage device;
determining, based both on the second priority of the second data partition and on the compression data, a second compression scheme for compressing the second data partition for storage in the multi-tiered storage device, wherein the second compression scheme differs from the compression scheme; and
compressing the second data partition using the second compression scheme to produce a compressed second data partition and storing the compressed second data partition in the storage tier with the compressed data partition.

4. The method of claim 1, further comprising:
computing priorities of data in the dataset based on access logs describing accesses to the dataset;
dividing the dataset into data partitions based on the priorities; and
determining the data partition from the data partitions.

5. The method of claim 4, wherein determining the data partition from the data partitions comprises:
identifying a first data partition of the data partitions, wherein the first data partition is associated with a first priority;
identifying a second data partition of the data partitions, wherein the second data partition is associated with a second priority;
determining that the first priority of the first data partition and the second priority of the second data partition are within a threshold range of each other; and
based on the first priority and the second priority being within a threshold range of each other, merging the first data partition and the second data partition to produce the data partition, wherein the data partition is smaller than a sum of a size the first data partition and a size of the second data partition.

6. The method of claim 1, wherein accessing the compression data describing results of compressing the data sample associated with the data partition using multiple compression schemes comprises determining the compression data, and wherein determining the compression data comprises:
compressing the data sample using the compression scheme selected from the multiple compression schemes;
providing, in the compression data, an indication of a compression ratio and a decompression time for the data sample using the compression scheme;
compressing the data sample using a second compression scheme selected from the multiple compression schemes; and
providing, in the compression data, an indication of a second compression ratio and a second decompression time for the data sample using the second compression scheme.

7. The method of claim 6, wherein determining the storage tier and determining the compression scheme comprise optimizing a cost function based on the compression data.

8. The method of claim 1, wherein determining the storage tier and determining the compression scheme comprise optimizing a cost function based both on the priority of the data partition and on the compression data.

9. The method of claim 8, wherein the cost function is further based on an overall storage cost of storing the dataset in the multi-tiered storage device.

10. A non-transitory computer-readable medium storing executable instructions, which when executed by a processing device, cause the processing device to perform operations comprising:
assigning, to a data partition of a dataset, a priority based on access patterns of the data partition;
accessing compression data describing results of compressing a data sample associated with the data partition using multiple compression schemes;
determining, based both on the priority of the data partition and on the compression data, a storage tier for storing the data partition in a multi-tiered storage device;
determining, based both on the priority of the data partition and on the compression data, a compression scheme for compressing the data partition for storage in the multi-tiered storage device; and compressing the data partition using the compression scheme to produce a compressed data partition and storing the compressed data partition in the storage tier.

11. The non-transitory computer-readable medium of claim 10, the operations further comprising:
computing priorities of data in the dataset based on access logs describing accesses to the dataset;
dividing the dataset into data partitions based on the priorities; and
determining the data partition from the data partitions.

12. The non-transitory computer-readable medium of claim 11, wherein determining the data partition from the data partitions comprises:
identifying a first data partition of the data partitions, wherein the first data partition is associated with a first priority;
identifying a second data partition of the data partitions, wherein the second data partition is associated with a second priority;
determining that the first priority of the first data partition and the second priority of the second data partition are within a threshold range of each other; and
based on the first priority and the second priority being within a threshold range of each other, merging the first data partition and the second data partition to produce the data partition, wherein the data partition is smaller than a sum of a size the first data partition and a size of the second data partition.

13. The non-transitory computer-readable medium of claim 10, wherein accessing the compression data describing results of compressing the data sample associated with the data partition using multiple compression schemes comprises determining the compression data, and wherein determining the compression data comprises:
compressing the data sample using the compression scheme selected from the multiple compression schemes;
providing, in the compression data, an indication of a compression ratio and a decompression time for the data sample using the compression scheme;
compressing the data sample using a second compression scheme selected from the multiple compression schemes; and
providing, in the compression data, an indication of a second compression ratio and a second decompression time for the data sample using the second compression scheme.

14. The non-transitory computer-readable medium of claim 10, wherein determining the storage tier and determining the compression scheme comprise optimizing a cost function based both on the priority of the data partition and on the compression data.

15. The non-transitory computer-readable medium of claim 14, wherein the cost function is further based on an overall storage cost of storing the dataset in the multi-tiered storage device.

16. A system comprising:
a memory component storing a dataset comprising data partitions;
a data partitioner module comprising program code for assigning, to a data partition of the data partitions, a priority based on access patterns of the data partition;
an optimization engine comprising program code for:
accessing compression data describing results of compressing a data sample associated with the data partition using multiple compression schemes;
determining, based both on the priority of the data partition and on the compression data, a storage tier for storing the data partition in a multi-tiered storage device; and
determining, based both on the priority of the data partition and on the compression data, a compression scheme for compressing the data partition for storage in the multi-tiered storage device;
a storage manager module comprising program code for compressing the data partition using the compression scheme to produce a compressed data partition and storing the compressed data partition in the storage tier; and
a processing device coupled to the memory component and configured to execute the program code of the data partitioner module, the optimization engine, and the storage manager module.

17. The system of claim 16, wherein the data partitioner module is further configured to perform operations comprising:
computing priorities of data in the dataset based on access logs describing accesses to the dataset; and
dividing the dataset into the data partitions based on the priorities.

18. The system of claim 17, wherein the data partitioner module is further configured to perform operations comprising:
identifying a first data partition of the data partitions, wherein the first data partition is associated with a first priority;
identifying a second data partition of the data partitions, wherein the second data partition is associated with a second priority;
determining that the first priority of the first data partition and the second priority of the second data partition are within a threshold range of each other; and
based on the first priority and the second priority being within a threshold range of each other, merging the first data partition and the second data partition to produce the data partition, wherein the data partition is smaller than a sum of a size the first data partition and a size of the second data partition.

19. The system of claim 16, further comprising a compression predictor module comprising program code for determining the compression data, wherein to determine the compression data the compression predictor module performs operations comprising:
compressing the data sample using the compression scheme selected from the multiple compression schemes;
providing, in the compression data, an indication of a compression ratio and a decompression time for the data sample using the compression scheme;
compressing the data sample using a second compression scheme selected from the multiple compression schemes; and
providing, in the compression data, an indication of a second compression ratio and a second decompression time for the data sample using the second compression scheme.

20. The system of claim 16, wherein the optimization engine is further configured to determine the storage tier and determine the compression scheme by optimizing a cost function based both on the priority of the data partition and on the compression data.

* * * * *